United States Patent [19]

Tran

[11] Patent Number: 5,068,705
[45] Date of Patent: Nov. 26, 1991

[54] JUNCTION FIELD EFFECT TRANSISTOR WITH BIPOLAR DEVICE AND METHOD

[75] Inventor: Liem T. Tran, Garland, Tex.

[73] Assignee: Texas Instruments Incorporated, Dallas, Tex.

[21] Appl. No.: 655,185

[22] Filed: Feb. 13, 1991

Related U.S. Application Data

[63] Continuation of Ser. No. 560,255, Jul. 31, 1990, abandoned, which is a continuation of Ser. No. 442,407, Nov. 28, 1989, abandoned, which is a continuation of Ser. No. 312,414, Feb. 21, 1989, abandoned, which is a continuation of Ser. No. 63,554, Jun. 18, 1987, abandoned.

[51] Int. Cl.$^5$ .................. H01L 27/02; H01L 29/161; H01L 29/167
[52] U.S. Cl. ........................ 357/43; 357/16; 357/63; 357/22; 357/34
[58] Field of Search .................. 357/43, 34, 22, 16, 357/63, 67, 71

[56] References Cited

U.S. PATENT DOCUMENTS

| H000,291 | 6/1987 | Boos | 357/67 |
| 3,576,475 | 4/1974 | Kronlage | 357/22 |
| 4,573,064 | 2/1986 | McLevige et al. | 357/15 |
| 4,739,386 | 4/1988 | Tanizawa | 357/22 G |
| 4,801,987 | 1/1989 | Otsubo et al. | 357/23.12 |
| 4,821,090 | 4/1989 | Yokoyama | 357/43 |

FOREIGN PATENT DOCUMENTS 0144242 6/1985 Japan ................... 357/43

Primary Examiner—Mark Prenty
Attorney, Agent, or Firm—Melvin Sharp; James T. Comfort; N. Rhys Merrett

[57] ABSTRACT

Vertical AlGaAs heterojunction bipolar transistors and GaAs junction field effect transistors are fabricated on a single gallium arsenide (GaAs) substrate to form an integrated circuit structure. The integration of these devices is made possible by a novel method of fabricating heterojunction inverted transistor integrated logic (HI2L) transistors with emitter reigons on the bottom (contacted through the substrate) while simultaneously forming the JFET structure with no additional processing steps. An ion implant technique is employed which uses an acceptor material to create a P type region, boron or protons to create insulating regions, and silicon or selenium to create an N type region. A zinc diffusion is used to form the bipolar P type ohmic contact regions and JFET gate regions in one operation. Bipolar collector and JFET source and drain metallization patterns are formed simultaneously followed by the simultaneous formation of bipolar base and JFET metallization patterns. Threshold voltages may be controlled by adjusting the zinc diffusion depth. The combination of bipolar and field effect devices on the single substrate allows the optimization of speed and power dissipation in large scale gallium arsenide integrated circuits.

16 Claims, 4 Drawing Sheets

JUNCTION FIELD EFFECT TRANSISTOR WITH BIPOLAR DEVICE AND METHOD

"This application is a continuation of Ser. No. 07/560,225, filed July 31, 1990, now abandoned, which is a continuation of Ser. No. 07/442,407, filed Nov. 28, 1989, now abandoned, which is a continuation of Ser. No. 07/312,414, filed Feb. 21, 1989, now abandoned, which is a continuation of Ser. No. 07/063,554, filed June 18, 1987, now abandoned."

BACKGROUND OF THE INVENTION

The present invention relates to electronic semiconductor devices and methods of fabrication, and, more specifically, to gallium arsenide bipolar devices that are formed with gallium arsenide FETs in a single substrate.

Semiconductor devices made of gallium arsenide are preferred over devices made of silicon for high frequency applications due to the higher mobility of carriers in gallium arsenide. In addition, most gallium arsenide technologies are expected to exhibit improved radiation hardness for total dose ionizing radiation over silicon Nevertheless, gallium arsenide material and fabrication technology lag far behind that of silicon. Indeed, gallium arsenide MESFET integrated circuits with 6,000 gates have been fabricated (for example, Terada et al, A 64 K GaAs Gate Array, 1987 ISSCC Dig. Tech Papers 144), but precise control of device parameters such as threshold voltage for larger scale integration continues to be a concern. Moreover, While GaAs MESFET technology has achieved subnanosecond switching speeds, problems associated with noise margins, operating temperature and device packing density continue to present limitations. Similarly, HEMTs, which use the two dimensional electron gas at a heterojunction of gallium arsenide and aluminum gallium arsenide, provide fast devices but suffer from lack of precise control of device parameters; see Mimura et al, High Electron Mobility Transistors for LSI Circuits, 1983 IEDM Tech. Digest 99. In contrast, JFET technology offers more fabrication flexibility without significant loss in device performance.

Bipolar transistors offer several potential advantages over the field-effect transistor for high speed applications. Higher operating speeds should be possible because the vertical dimensions (layers) of a bipolar structure may be smaller than the lithographically limited horizontal dimensions of the FET thereby reducing the dimensions of critical current paths. In addition, tho threshold voltage for the commonly employed bipolar devices is largely dependent on the base bandgap whereas the FET threshold voltage depends on device geometry and doping levels which are much harder to control. Furthermore, the bipolar process offers improved temperature performance making it an ideal candidate for high temperature/high radiation environments. For background, see M. Nowogrodzki, Advanced III-IV semiconductor Materials Technology Assessment 1984, which is hereby incorporated by reference.

The recognized advantages of GaAs bipolar technology have been recently realized in the fabrication of a 4 K gate array which employed heterojunction inverted transistor integrated logic (HI2L) (Yuan et al, A 4 K GaAs Gate Array, 1986 ISSCC Dig. Tech. Papers 74). However, since HI2L transistors all have their emitters grounded, a larger scale circuit fabricated with only HI2L devices has a relatively high power consumption compared to a FET equivalent Accordingly, it would be desirable to exploit the advantages of both HI2L and FET GaAs technology as the need for higher levels of integration increases.

SUMMARY OF THE INVENTION

In accordance with the present invention, there is provided a bipolar transistor and a field-effect transistor on a single substrate with a method of fabrication, wherein both devices can be formed by using the same number of masking operations required for an exclusively bipolar process The implementation of bipolar devices on a gallium arsenide substrate using a modified form of I2L logic and the selective incorporation of junction field effect transistors on the same substrate by using a novel method of fabrication make it possible to exploit both the high speed of bipolar structures and the reduced power dissipation of field effect technology in a single integrated circuit. More specifically, the above is accomplished by providing a layered structure with layers of N+ type aluminum gallium arsenide, P type gallium arsenide and N type gallium arsenide which are all epitaxially grown on a gallium arsenide substrate. Beryllium is selectively implanted to form P+ contact regions for the bipolar devices. Zinc is selectively diffused into the P+ contact regions and regions wherein JFET devices are desired to form ohmic contact regions for the bipolar devices and the gate regions for the JFET devices. Ohmic contacts are formed on N-type collector and JFET source/drain regions by the deposition of a gold germanium alloy covered by nickel Finally, contacts to the bipolar base and JFET gate regions are formed by the deposition of a gold zinc alloy. The above process steps are in some respects similar to those disclosed by W. V.. McLevige et al in U.S. patent application Ser. No. 317,367, filed Nov. 2, 1981, which is now U.S. Pat. No. 4,573,064 and is hereby incorporated by reference. This patent discloses a process for forming an inverted bipolar transistor in a gallium arsenide substrate which does not incorporate field effect transistor technology.

In another aspect of the invention, the epitaxial layers do not include AlGaAs but rather are made up of only GaAs material. This method offers simplified processing with some trade off in device performance since the Wide band-gap AlGaAs emitter region provides improved emitter injection efficiency and higher current gain.

DETAILED DESCRIPTION OF THE PREFERRED EMBODIMENT

Figure 1:
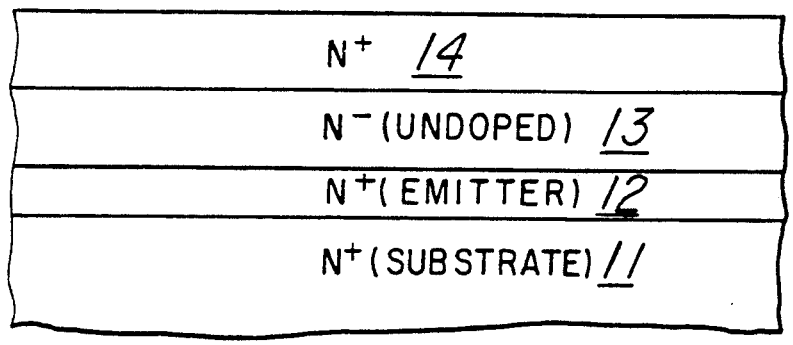
FIG. 1 is a cross-sectional view of the substrate material with epitaxial layers in place over the substrate.

As shown in FIG. 1, one embodiment of the present invention begins with a structure having a substrate wafer of gallium arsenide (GaAs) 11 approximately 15 mils thick. This substrate material is doped with an appropriate donor material to make the substrate heavily N-doped. This may be accomplished by doping with, for example, silicon at a level of $10^{18}$ per cm$^3$ or greater. Next, a layer 12 of Al$_x$Ga$_{1-x}$As having a thickness of approximately 2 microns is grown by, for example, molecular beam epitaxy (MBE). This layer will form the buried emitter of the inverted heterojunction bipolar device and is not drawn to scale in FIG. 1. The percentage of aluminum in the alloy is preferably defined by x having a range of from 0.5 to 0.1. For instance, 10% substitution of aluminum (x=0.1) causes a 100 meV increase in the bandgap which significantly increases emitter efficiency and transistor gain. Higher percentages of aluminum provide essentially no further increase in transistor gain and processing becomes more difficult. Layer 12 is next doped with an appropriate N-type material such as silicon to a concentration of approximately $10^{18}$ per cm$^3$ In an alternative embodiment, the layer 12 may be formed by growing a GaAs region to a thickness of approximately 1.6 microns by a vapor phase epitaxy (VPE) process. This layer may be doped with a donor material, for example sulphur, to a level of approximately $10^{18}$ per cm$^3$, making the layer heavily n type. The next layer of the structure is a layer of GaAs 13 of approximately 0.2 micron thickness, which is undoped. Donor concentration in the undoped GaAs is approximately $10^{15}$ per cm$^3$ due to remnant impurities. The final layer of the structure is a layer of GaAs 14 of approximately 0.3 micron thickness which is doped with, for example, silicon at a level of approximately $5 \times 10^{17}$ per cm$^3$.

The first N+ epitaxial layer is not necessary for proper electrical operation, but is provided to reduce the defect density of the emitter region and provide better physical characteristics at the emitter/base junction. In an alternative embodiment, the N+ gallium arsenide substrate 11 could be used as the emitter.

Processing continues by annealing the structure at 850 degrees C. in an arsenic over-pressure atmosphere for 15 minutes. This technique is similar to that described in R. P. Mandal et al, Ion-Implanted Gallium Arsenide With Proximity Cap Annealing, Gallium Arsenide and Related Compounds, 1978, Conf. Ser. No. 45, Institute of Physics, pp. 462–471, 1979. In the present process, the flowing arsenic vapor is derived from a heated GaAs source and the atmosphere is composed of a hydrogen carrier gas at one atmosphere and a partial pressure of arsenic vapor between $10^{-1}$ and $10^{-7}$ atmospheres.

Figure 2:
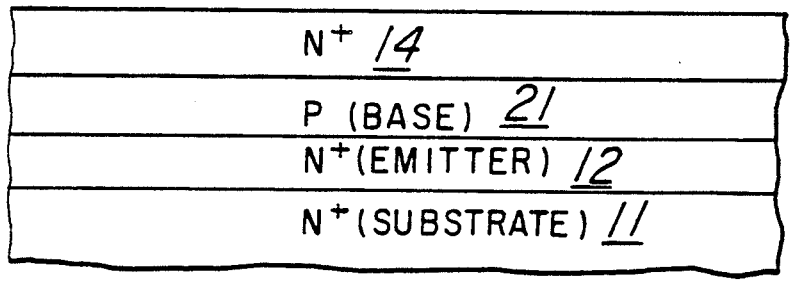
FIG. 2 is a cross-sectional view of the structure after an implant in the base regions.

The structure is next implanted with, for example, $8 \times 10^{12}$ cm$^{-2}$ of Be at 180 kEv to form the base region of the bipolar device. Other implant dopant sources that could be used include Mg, Cd, or Zn. The region resulting from this implant is shown in FIG. 2 as region 21 formed in layer 13 of FIG. 1. The structure is again annealed for approximately 15 minutes at 850 degrees C. as described above. With reference to FIG. 2 it can be seen that the four layer structure existing at this stage of the process forms the necessary material from which to develop the bipolar emitter, base, and collector regions as well as the field effect device channel region.

Figure 3:
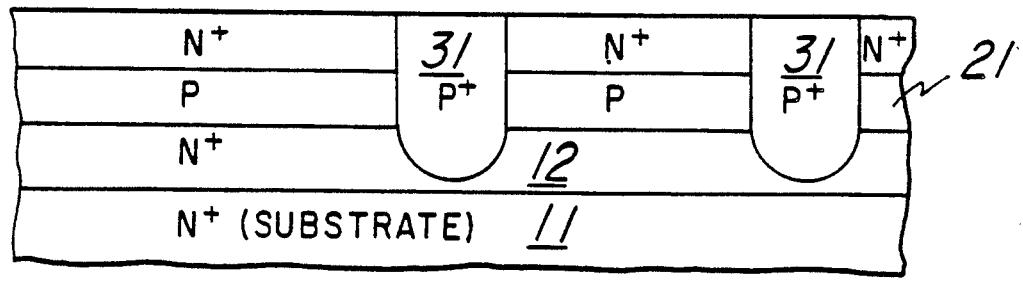
FIG. 3 is a cross-sectional view of the structure after an implant which forms the base contact region.
Figure 4:
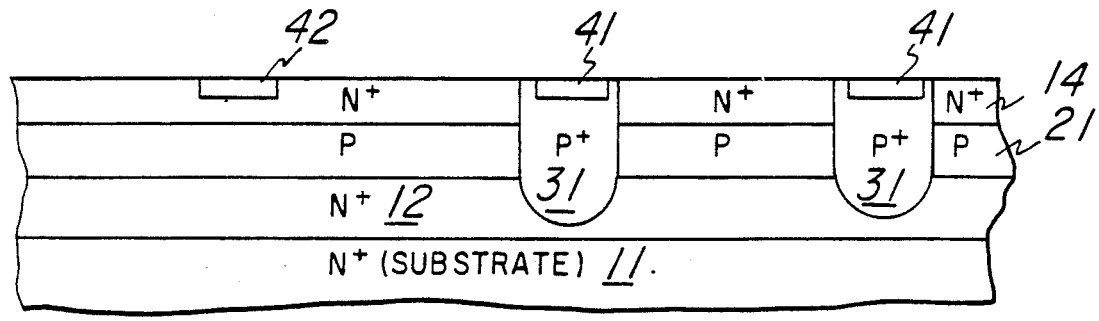
FIG. 4 is a cross-sectional view of the structure after a diffusion to form the ohmic contact regions for the bipolar base and the gate region for the field effect device.

Referring now to FIG. 3, P+ regions 31 are selectively formed using si$_3$N$_4$/photoresist masking and a two step implantation process. In the first step, Be for example, may be implanted at a dosage of $2 \times 10^{14}$ cm$^{-2}$ at 80 keV. The same material may then be implanted in a second operation at a dosage of $3 \times 10^{14}$ cm$^{-2}$ at 80 keV. The two implant steps allow a more uniform doping profile as well as reduced surface resistance enabling lower ohmic base contact resistance. The above implant process is followed by proximity annealing at 700 degrees C. for 30 minutes. The low temperature anneal is necessary in this case to limit Dc diffusion at high concentrations Referring now to FIG. 4, regions 41 are selectively formed to create P-type ohmic contact regions for the bipolar base while simultaneously creating the field effect transistor gate region 42. This may be accomplished by the selective diffusion of zinc into P+ regions 31 to form base contacts while selectively diffusing the same material into the N+ region 22 to form the JFET gate in an area that will be later isolated from the bipolar structure. The zinc diffusion step is accomplished by selectively depositing silicon oxide doped with zinc to a level of approximately 10% (atomic) and heating the structure for 10 seconds at 700 degrees C. The high temperature operation causes the zinc to diffuse into the gallium arsenide to a depth of approximately 0.1 micron. Adjustments may be made to either time or temperature to effect a change in diffusion depth and a corresponding change in the threshold voltage of the finished FET. The oxide source is then stripped using standard oxide removal techniques It should be recognized that the process as described to this point has provided a controllable JFET gate region while at the same time providing for high concentration P-type regions for ohmic contacts to the base of a bipolar device constructed on the same substrate. In an alternative embodiment, regions 41 and 42 of FIG. 4 may be formed by the selective ion implantation of zinc or magnesium.

Figure 5:
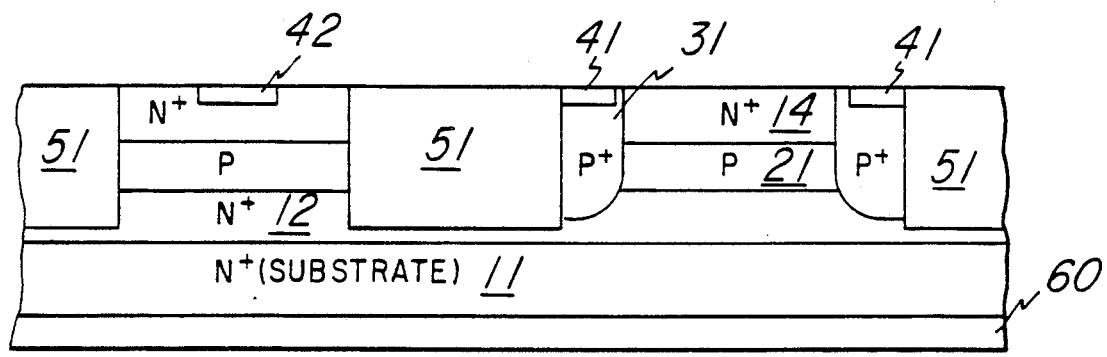
FIG. 5 is a cross-sectional view of the structure after an implant to create device isolation regions.

Referring now to FIG. 5, an implant process is used to create isolation regions 51 which will serve the purpose of insulating the various individual devices formed in the substrate. The implant process may be implemented by a three step implantation of boron under various implant conditions. For example, boron may be implanted in three steps at $2 \times 10^{12}$ cm$^{-2}$ at 50 keV, $4 \times 10^{12}$ cm$^{-2}$ at 140 keV and $6 \times 10^{12}$ cm$^{-2}$ at 320 keV respectively. These implants create isolation regions by damaging the GaAs material to the point that it becomes a highly resistive semi-insulator which effectively isolates the various components. The above described isolation implant processing may be accomplished by using other light, non-doping ions such as hydrogen at dosage levels that are sufficient to damage the lattice structure. Subsequent high-temperature steps should be avoided to prevent annealing of the lattice damage and a corresponding decrease in resistivity. In the presently preferred embodiment, processing at temperatures above 600 degrees C. after isolation implant is avoided. In addition to achieving a potentially dense isolation arrangement, the implant technique used in the preferred embodiment results in a planar structure that offers improved interconnect step coverage.

Still referring to FIG. 5, a gold germanium alloy (88% gold, 12% germanium) layer 60 is next deposited on the backside of substrate 11 to provide a means of electrical contact to the bipolar emitter region. This layer may be approximately 3,000 angstroms thick. The layer is alloyed by exposing the structure to 400 degrees C. for approximately 1 minute.

Figure 6:
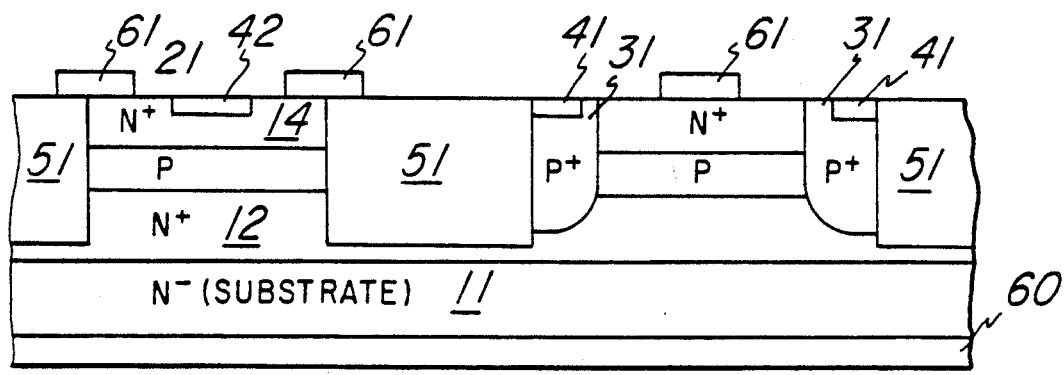
FIG. 6 is a cross-sectional view of the structure after contact material for bipolar collector and field effect device source and drain regions has been deposited.

As shown in FIG. 6, ohmic contacts 61 are made to the N+ regions which form the bipolar collector and the JFET source and drain by depositing a gold/germanium alloy (88% gold, 12% germanium) covered by nickel. The total thickness of these materials may be about 1500 angstroms with the nickel having a thickness about 25% of that for the gold/germanium. Following the deposition as described, the structure is again annealed at approximately 400 degrees C. for about 1 minute.

Figure 7:
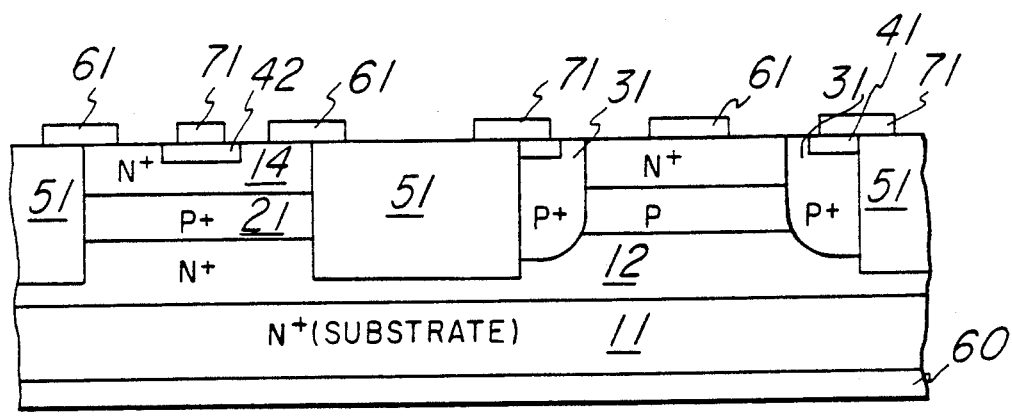
FIG. 7 is a cross-sectional view of the structure after contact material for bipolar base and field effect device gate has been deposited.

Referring next to FIG. 7, P+ bipolar base ohmic contacts and JFET gate electrodes 71 are formed at the same time by evaporating AuZn film on the surface using well known techniques. The total thickness of this material should be approximately 3,000 angstroms. After AuZn deposition the structure is annealed at 375 degrees C. for about 1 minute.

In an alternative embodiment, P+ contacts and gate electrodes may be formed by an alloy of silver and manganese in a ratio of approximately 92% silver and 8% manganese. The total thickness of the combined material may be approximately 2,000 angstroms. Following the P+ contact and gate electrode deposition, the structure is again annealed at approximately 375 degrees C. for about 1 minute.

Figure 8:
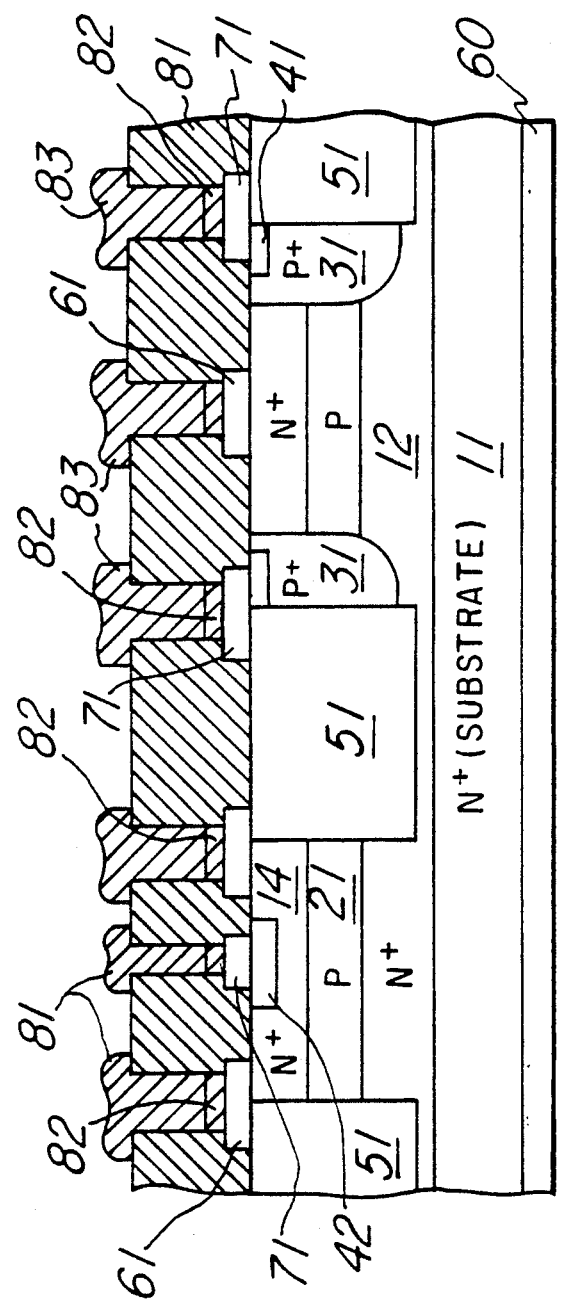
FIG. 8 is a cross-sectional view of the structure after the deposition of insulating material interconnect metallization.

The device structure at this stage is ready for final processing which may include the well known methods of depositing an insulating layer and metallization interconnect layers. As shown in FIG. 8 for example, a layer of silicon dioxide 81 may be deposited using standard chemical vapor deposition (CVD) techniques. This layer is deposited over the entire surface of the structure to a thickness of approximately 6,000 angstroms. The oxide insulator may then be patterned and vias or windows etched using, for example, the well known reactive ion etching process (RIE). The process continues by depositing the interconnect metallization. An appropriate metallization may be a first 1000 angstrom layer 82 of titanium tungsten (TiW) covered by a second 6000 angstrom layer 83 of gold. Both layers are deposited using standard magnetron sputtering techniques. This metallization arrangement allows for an acceptable interconnect system while providing a Schottky metal for Schottky-barrier fan out isolation devices should the design require such.

Figure 9:
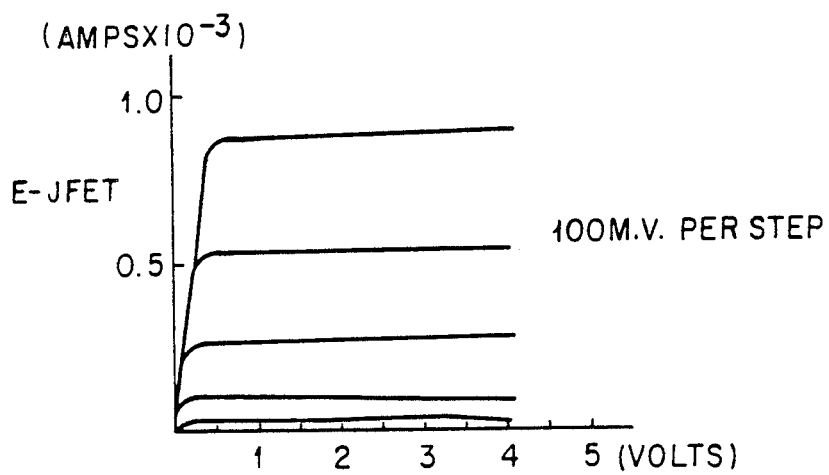
FIG. 9 is a graphical plot of current versus voltage for the enhancement mode field effect transistor in the structure of FIG 7.

With reference now to FIG. 9, there is shown the current voltage characteristics of an enhancement mode JFET manufactured by tho process described as the principle embodiment. These very acceptable characteristics were measured on a device that demonstrated a $g_m$ of 85 ms/mm and had a gate length of 40 microns.

Figure 10:
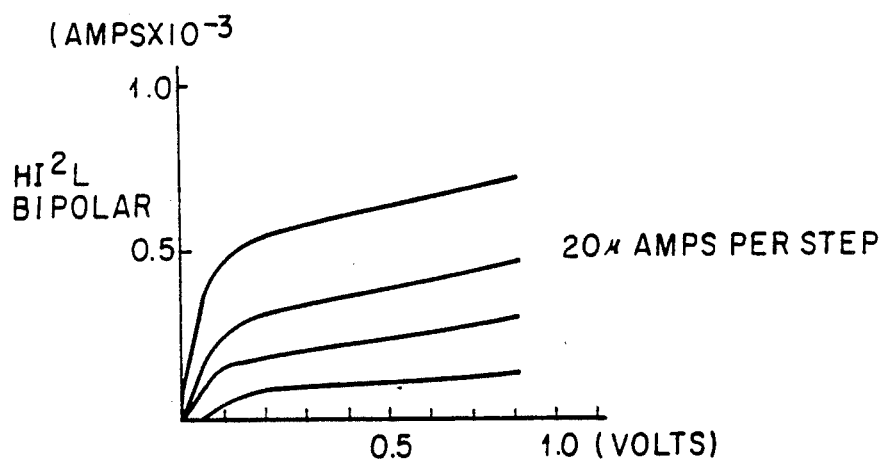
FIG. 10 is a graphical plot of current versus voltage for the HI2L bipolar device in the structure of FIG. 7.

FIG. 10 depicts the current voltage characteristics of an HI2L bipolar device that Was processed in accordance with present invention on the same substrate as that of the device represented by the characteristics of FIG. 8. This device exhibited very desirable characteristics and a $h_{fe}$ of 12.

Numerous modifications of the preferred embodiment devices and methods may be made While retaining the desirable characteristics of both bipolar and field effect structures on a single gallium arsenide substrate. For example, layer 12 of FIG. 1 may be formed by growing GaAs on substrate 11 to a thickness of approximately 1.6 microns by a vapor phase epitaxy (VPE) process. This layer may then be doped with a donor material, for example sulphur, to a level of approximately $10^{18}$ per $cm^3$, making the layer heavily N type. The final structure of FIG. 8 will remain as shown except for the choice of the compound group III-IV semiconductor material that forms the buried emitter (layer 12). By using GaAs for this layer rather than AlGaAs as shown in the preferred embodiment, a homojunction bipolar device will be formed. While the high gains associated with the wide bandgap aluminum gallium arsenide emitter will be sacrificed with this substitution, an acceptable device structure Will be formed with a less complex process since the epitaxial growth of GaAs is easier to achieve than the growth of AlGaAs. The resulting dopant levels and approximate thicknesses of the doped layers for the homojunction embodiment should be as follows. The emitter region is doped from $2 \times 10^{17}$ to $2 \times 10^{18}$ per $cm^3$ N type with a thickness of 2 to 10 microns. The base region is doped P type from $5 \times 10^{16}$ to $5 \times 10^{17}$ per $cm^3$ with a thickness of 0.1 to 0.6 microns. The collector region is doped n type from $5 \times 10^{16}$ to $5 \times 10^{18}$ per $cm^3$ with a thickness of 0.2 to 0.6 microns. It should be noted that the doping level of the emitter in this alternate embodiment should be at least 5 times that of the base. This doping ratio is less critical in the case of the heterojunction preferred embodiment.

The structure and method disclosed in the present invention represent an important advance to the continued development of large scale high speed gallium arsenide technology. The improved radiation hardness and high temperature performance of bipolar gallium arsenide device structures combined with the power conservation possible in designs that employ FET devices make the integrated technology superior to previous processes when the speed power product is a consideration. This is particularly true of I²L circuits wherein the transistor emitters are grounded and higher power dissipation results. For example, a typical speed power product for a bipolar gate may be 300 fJ whereas an FET gate may exhibit a speed power product of 500 fJ. Moreover, in designs such as memory arrays, the FET devices as disclosed in the present invention offer an improvement in packing density. Therefore, it is possible to envision more highly integrated gallium arsenide memories and logic circuits that offer high speed at lower power levels and that are suitable for high radiation/high temperature environments The structures disclosed in the present invention are made possible by the novel method which allows the incorporation of both bipolar and field effect device technology on a single gallium arsenide substrate with no masking levels needed beyond those required to process the bipolar device.

While the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications

I claim:

1. A semiconductor integrated circuit comprising:
   (a) a first layer of a first semiconductor material doped to a first conductivity type and including a bipolar transistor emitter region;
   (b) a second layer of a second semiconductor material doped to a second conductivity type on said first layer and including a bipolar transistor base region;
   (c) a third layer of said first semiconductor material doped to said first conductivity type on said second layer and including a bipolar transistor collector and a field effect transistor region;
   (d) a first doped region in said second and third layers of said second conductivity type for making contact to said second layer at a selected location;
   (e) a second doped region within said first doped region of said second conductivity type for making contact to said first doped region;
   (f) a third doped region in said field effect transistor region of said second conductivity type providing the gate region of said junction field effect transistor and defining source and drain regions adjacent to said gate region;
   (g) an isolation region extending through said second and third layers at a selected location thereof and at least partially surrounding said field effect transistor region to electrically isolate said field effect transistor region from other portions of said second and third layers; and
   (h) a plurality of electrical conductors selectively disposed on said second and third doped regions, said collector and emitter regions, and said source and drain regions to provide electrical contact terminals for said bipolar transistor and said junction field effect transistor.

2. An integrated circuit as recited in claim 1, wherein said first, second, and third layers are each a compound of elements taken from table groups III and V of the period table.

3. An integrated circuit as recited in claim 2, wherein at least one of said layers is gallium arsenide.

4. An integrated circuit as recited in claim 1, wherein said first and third layers are gallium arsenide compounds and said second layer is aluminum gallium arsenide.

5. An integrated circuit as recited in claim 1, wherein said second and third doped regions are doped with the same element.

6. An integrated circuit as recited in claim 1, wherein said first doped region is doped with beryllium and said second and third doped regions are doped with zinc.

7. An integrated circuit as recited in claim 1, said electrical conductors comprising:
   a gold-zinc layer disposed on said second and third doped regions; and
   a gold-germanium alloy layer disposed on said emitter, collector, source and drain regions.

8. An integrated circuit having a bipolar transistor and a field effect transistor comprising:
   (a) a semiconductor substrate doped a first conductivity type and providing the emitter region of said bipolar transistor;
   (b) a first layer of a first semiconductor material doped a second conductivity type on said substrate and providing the base region of said bipolar transistor;
   (c) a separate second layer of semiconductor material doped said first conductivity type on said first layer and providing the collector region of said bipolar transistor and a field effect transistor region;
   (d) a first doped region in said second conductivity type disposed within said first and second layers for making contact to said base region at a selected location;
   (e) a second doped region doped said second conductivity type disposed within said first doped region to provide an ohmic contact area;
   (f) a third doped region doped said second conductivity type disposed within said field effect transistor region to provide a junction gate and defining source and drain regions adjacent said gate;
   (g) an ion implanted isolation region extending through said first and second layers and at least partially surrounding said field effect transistor region to electrically isolate said field effect transistor region from other portions of said first and second layers; and
   (h) a first electrical conductor disposed on said collector region and said source and drain regions to provide electrical contact to said collector, source and drain regions; and
   (i) a second electrical conductor disposed on said second and third doped regions to provide electrical contact to said second and third doped regions.

9. An integrated circuit as recited in claim 8, wherein said substrate and said layers are compounds of elements selected from periodic table groups III and V.

10. An integrated circuit as recited in claim 9, further comprising:
    an insulating layer disposed on said second layer and said first and second electrical conductors;
    a layer of titanium tungsten on said insulating layer and making contact to said electrical conductors through vias in said insulating layer at selected locations; and
    a layer of gold on said layer of titanium tungsten, said gold and titanium tungsten layers forming electrical interconnections between said bipolar transistor and said field effect transistor.

11. An integrated circuit as recited in claim 8, wherein said substrate is aluminum gallium arsenide and said first and second layers are gallium arsenide.

12. An integrated circuit as recited in claim 8, wherein said second and third doped regions are doped with the same impurity element.

13. An integrated circuit as recited in claim 8, wherein said second and third doped regions are doped with zinc.

14. A semiconductor integrated circuit including:
   (a) a single semiconductor chip having a first doped layer in an upper portion thereof,
   (b) said chip containing therein a bipolar transistor having an emitter region, a base region having a base contact region coupled thereto, said base contact region extending through said first doped layer and collector region and a junction field effect transistor electrically isolated from said bipolar transistor, said junction field effect transistor having a gate region,
   (c) said gate region of said field effect transistor and said collector region of said bipolar transistor being at least partially disposed in said first doped layer, and (d) a first doped region disposed in an upper surface portion of said base contact region and spaced from said collector region of said bipolar transistor, said first doped region providing a contact area for said bipolar transistor.

15. The integrated circuit as recited in claim 14, wherein said gate region and said first doped region include the same dopant therein.

16. The integrated circuit as recited in claim 14, wherein said gate region and said first doped region are doped with zinc.

* * * * *